United States Patent [19]
Gardner et al.

[11] Patent Number: 5,614,740
[45] Date of Patent: Mar. 25, 1997

[54] HIGH-SPEED PERISTALTIC CCD IMAGER WITH GAAS FET OUTPUT

[75] Inventors: David W. Gardner, Colorado Springs; Thomas E. Linnenbrink, Monument; Stephen D. Gaalema, Colorado Springs, all of Colo.

[73] Assignee: Q-Dot, Inc., Colorado Springs, Colo.

[21] Appl. No.: 346,826

[22] Filed: Nov. 30, 1994

Related U.S. Application Data

[63] Continuation of Ser. No. 698,315, May 10, 1991, abandoned.

[51] Int. Cl.$^6$ .......................... H01L 27/148; H01L 29/768
[52] U.S. Cl. ........................... 257/222; 257/223; 257/220
[58] Field of Search ................................. 257/222, 223, 257/213, 220

[56] References Cited

U.S. PATENT DOCUMENTS

| | | | |
|---|---|---|---|
| 3,921,195 | 11/1975 | Smith et al. | 257/246 |
| 4,012,759 | 3/1977 | Esser | 257/220 |
| 4,264,915 | 4/1981 | Bierhenke et al. | 257/217 |
| 4,280,068 | 7/1981 | Snijder | 307/221 |
| 4,338,515 | 6/1982 | Herbst et al. | 168/647 |
| 4,513,431 | 4/1985 | Chamberlain et al. | 377/60 |
| 4,527,182 | 7/1985 | Ishihara et al. | 257/223 |
| 4,577,233 | 3/1986 | Kimata | 358/213 |
| 4,613,895 | 9/1986 | Burkey et al. | 358/41 |
| 4,620,231 | 10/1986 | Kosonocky | 358/213 |
| 4,636,980 | 1/1987 | Bluzer | 365/106 |
| 4,654,683 | 3/1987 | Anagnostopoulos et al. | 357/24 |
| 4,696,021 | 9/1987 | Kawahara et al. | 377/58 |
| 4,697,200 | 9/1987 | Miyatake | 357/24 |
| 4,779,124 | 10/1988 | Hynecek | 357/24 |
| 4,800,435 | 1/1989 | Ikeda et al. | 358/213.19 |
| 4,823,178 | 4/1989 | Suda | 357/30 |
| 4,845,540 | 7/1989 | Baker et al. | 907/691 |
| 4,851,890 | 7/1989 | Miyatake | 257/223 |
| 4,851,915 | 7/1989 | Yang et al. | 257/223 |
| 4,908,518 | 3/1990 | Losee et al. | 358/213.23 |
| 4,926,225 | 5/1990 | Hosack | 357/24 |
| 4,929,913 | 5/1990 | Sato | 330/308 |
| 4,975,777 | 12/1990 | Lee et al. | 358/213.19 |
| 5,063,581 | 11/1991 | Akimoto et al. | 377/58 |
| 5,191,399 | 3/1993 | Maegawa et al. | 257/223 |

FOREIGN PATENT DOCUMENTS 3-62529  3/1991  Japan.

OTHER PUBLICATIONS

Gradl, David A., "CCD Sampling of High–Frequency Broad–Band Signals," *IEEE Journal of Solid–State Circuits*, vol. SC 17, No. 3, Jun. 1982, pp. 619–626.

Hynecek, Jaroslav, "Virtual Phase Technology: A New Approach to Fabrication of Large–Area CCD's," *IEEE Transactions on Electron Devices*, vol. ED–28, No. 5, May 1981, pp. 483–489.

Wadsworth, M.,. Hosack, H., and Freeman, J., "A 640 Megapixel/Sec 512×512 Interline Transfer Virtual Phase CCD," *International Electron Devices Meeting 1986 Technical Digest*, Dec. 7–10, 1986, Los Angeles, CA, pp. 357–360.

Army Projects, Abstracts of Phase I Awards from FY 1987 SBIR Solicitation, U.S. Department of Defense, Small Business Innovation Research Program, NTIS Publication No. AD–A195 727, vol. I, p. 146.

Army Projects, Abstracts of Phase II Awards from FY 1987 SBIR Solicitation, U.S. Department of Defense, Small Business Innovation Research Program, NTIS Publication No. AD–A230 994, vol. I, p. 60.

*Primary Examiner*—Stephen Meier
*Attorney, Agent, or Firm*—Welsh & Katz, Ltd.

[57] ABSTRACT

An improved CCD imaging array is disclosed which is capable of operating at 10,000 frames-per-second. The imager consists of an array of 512×512 pixels having 16 serial output channels which provides a composite output data rate up to 250 Megasamples/second. The serial output registers are constructed from peristaltic CCDs, each having a GaAs FET output circuit bump-mounted to the silicon substrate. A four-layer pinned photodiode is utilized as the photodetector, and each photodiode has its own antiblooming drain. The antiblooming gates double as an optical shuttering device. Sample-and-hold output circuitry is also provided.

10 Claims, 13 Drawing Sheets

HIGH-SPEED PERISTALTIC CCD IMAGER WITH GAAS FET OUTPUT

This application is a continuation of Ser. No. 07/698,315 filed May 10, 1991, now abandoned.

FIELD OF THE INVENTION

The present invention relates generally to electronic imaging arrays utilizing charge-coupled device (CCD) technology. More particularly, the present invention pertains to a CCD imager of the interline transfer type having output registers constructed of peristaltic CCDs and having output devices constructed of a combination of gallium arsenide (GaAs) and silicon field-effect transistors (FETs).

BACKGROUND OF THE INVENTION

Solid state imaging arrays are semiconductor devices which are used to convert an optical image into an electrical signal. The light-sensitive semiconductor surface is arranged in a matrix of picture elements called pixels, each including a photodetector in which electrical charges are introduced when light from a scene is focused on the surface of the device. Photons striking the surface of the photodetector generate free electrons in an amount linearly proportional to their radiant energy. Hence, the amount of charge collected as a charge packet in the photodetector will be a faithful representation of the intensity of the image at that pixel location. These charge packets are then periodically transferred into a CCD shift register.

When the charge packets are introduced into the CCD, they are stored in a spatially-defined depletion region, or potential well. The potential well is located either at or under the surface of the semiconductor device, depending upon the type of CCD technology used. In a surface channel CCD, minority charge is stored in a spatially-defined depletion region at the surface of the semiconductor. The formation of the potential well is controlled by the manipulation of voltages applied to the surface electrodes, or gates. The charge packets are transferred to similar adjacent wells by providing a more attractive potential for the charge in the desired direction. Clocking signals having different phases and/or voltage levels are applied to the gates and are used to control the potential wells.

A second type of CCD is called a buried channel device, as opposed to a surface channel device. In buried channel CCDs, a channel implanted within the silicon surface is used to help transfer the charge packets. Therefore, the charge is located within the bulk silicon such that the potential maximum does not occur at the surface of the semiconductor device. Since the fringing fields are much greater below the surface, the charge transfer can be much faster. In addition, storing the charge away from the silicon/silicon-dioxide interface results in greatly improved charge transfer efficiency. Thus, an additional benefit of buried channel CCDs over surface channel CCDs is its low noise performance.

A third type of CCD is called a peristaltic CCD. In a peristaltic charge-coupled device, the charge packet transferring operation is similar to the peristaltic contractions and dilations of the digestive system. The peristaltic CCD has an additional implant that not only keeps the charge away from the silicon/silicon-dioxide interface, but also generates an extremely large lateral electric field from one gate to the next. This provides an additional driving force to aide in transfer of the charge packets. When the charge packets are shifted out of the CCD, amplified, and applied to an analog-to-digital converter for digitization, an accurate electrical representation of the optical image is created.

A typical digitized image may be constructed from a 512×512 array containing approximately 250,000 pixels. Today's applications for solid state imagers require frame rates in excess of 1000 frames-per-second (fps) on imagers of 512×512 pixels or larger. The required optical bandwidth of the imagers must extend from infrared to ultraviolet radiation, i.e., 250–1000 nanometers (nm) wavelength. This high frame rate, combined with the large imager size and wide bandwidth requirements, presents very demanding specifications which are quite difficult and costly to achieve.

One of the major problems in building high-speed imagers is how to quickly transfer the electrical signal out of the imager. By dividing the imager into a number of sections, and by using multiple output structures, the imager performance can be dramatically increased. However, present-day CCD and silicon metal-oxide-semiconductor (MOS) technology severely limits the maximum speed with which the imager can output data.

Another problem with high-speed imagers lies with the photodetector. Two types of photodetectors are commonly used in solid state imaging arrays, i.e., the MOS capacitor and the P-N junction photodiode. The major difference between the two types of photodetectors is apparent in their optical bandwidths. The polysilicon gates overlying the active regions of the MOS photosite become opaque at optical wavelengths of less than approximately 450 nm. Since the P-N junction photodiode is not covered by a polysilicon gate, its optical bandwidth can extend down to 200 nm. However, the P-N Junction photodiode has other problems. When transferring photo-generated charge from the active photosite into the CCD shift register, the charge transfer process is not 100% complete, i.e., some of the signal electrons cannot be transferred during the required transfer period and remain in the photodiode. This incomplete transfer of the charge packet produces an effect known as image lag, which manifests itself as a smearing of the image. The problems associated with image lag become increasingly apparent as the imager's frame rate is increased.

A further problem occurs when the photodetector is illuminated by a scene in which certain regions are exposed to more intense radiation than other regions. The photodetector often becomes overloaded and produces excess charge which tends to spread out throughout the CCD channel. This charge spreading is exhibited as a blooming or blurring of the image. A common approach to blooming control is to provide an overflow drain in the channel stops of the CCD, which collect the excess charge. However, prior antiblooming techniques have not proven successful for high-speed imagers having a wide dynamic range of sensitivity.

A need, therefore, exists to provide a high-speed 512×512 imager which overcomes these deficiencies in the prior art.

OBJECTS AND SUMMARY OF THE INVENTION

A primary object of the present invention is to provide a high-speed CCD imager which is capable of frame rates in excess of 1000 fps on imagers of 512×512 pixels or larger.

Another object of the present invention is to provide a high-speed imager having an optical bandwidth extending from 250–1000 nm radiation.

Yet another object of the present invention is to provide a photodetector structure for an imager which exhibits improved image lag performance with high quantum efficiency.

A further object of the present invention is to provide an imager structure having antiblooming capabilities which can also serve the function of electronic shuttering.

Still another object of the present invention is to provide a high-speed output structure for a CCD imager which has improved gain stability and offset correction.

These and other objects are achieved by the present invention which, briefly stated, is a charge-coupled device (CCD) imager of the interline transfer type which achieves high frame rate operation by utilizing a number of parallel output structures each operating at very high data rates. The imager comprises an array of 512×512 pixels having 16 serial output channels operating simultaneously. Each of the serial output shift registers are constructed of peristaltic CCDs, as opposed to buried channel CCDs. Furthermore, each of the output structures comprise gallium arsenide (GaAs) amplifiers bump-mounted onto the silicon semiconductor material. The output structures further comprise a silicon amplifier with capacitive feedback, and a GaAs field-effect transistor (FET) buffer and sample-and-hold circuit. A four-layer pinned photodiode is utilized as the photodetector, and each photodiode has its own antiblooming structure which doubles as an optical shuttering device.

BRIEF DESCRIPTION OF THE DRAWINGS

The features of the present invention which are believed to be novel are set forth with particularity in the appended claims. The invention itself, however, together with further objects and advantages thereof, may best be understood with reference to the following description when taken in conjunction with the accompanying drawings, in which:

FIG. 4b is a pictorial representation of the potential well profiles for the pixel shown in FIG. 4a;

FIG. 5b is a pictorial representation of the potential well profiles for the pixel shown in FIG. 5a;

FIG. 5c illustrates timing diagrams for the signals for performing the electronic shuttering of the CCD shown in FIG. 5a;

FIG. 6b is an electrical schematic diagram of the preamplifier and sample-and-hold circuits shown in FIG. 6a;

DETAILED DESCRIPTION OF THE INVENTION

Figure 1:
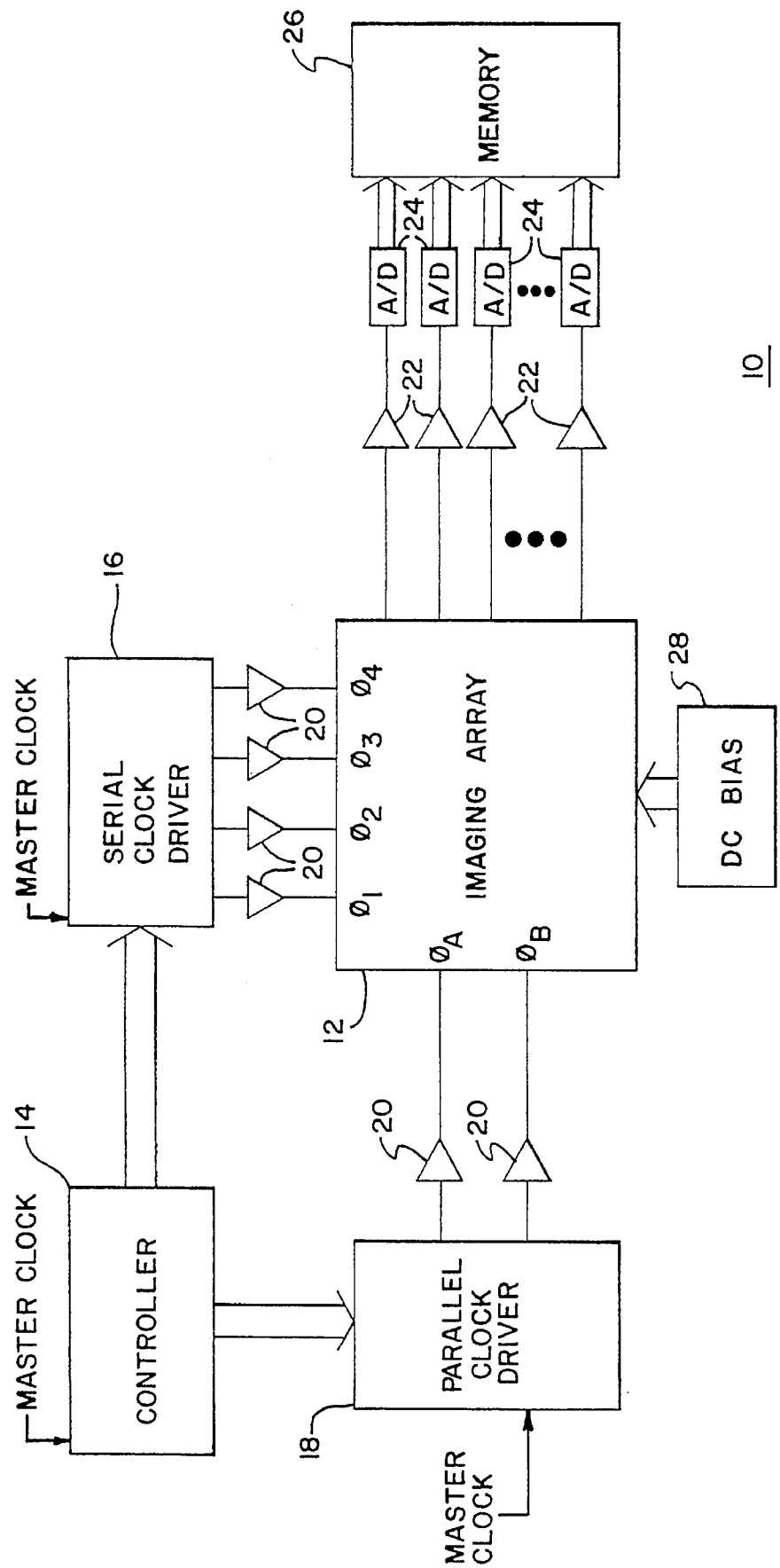
FIG. 1 is a block diagram of the CCD imaging system according to the present invention.

Referring now to FIG. 1, a complete electronic imaging system 10 is illustrated in accordance with the present invention. The imaging array 12 is configured as a 512×512 matrix built on a single semiconductor chip, wherein each pixel of the matrix includes a photodetector and a section of a CCD shift register. The photodetector, a P-N junction photodiode in this instance, accumulates charge packets when exposed to light. Charge packet transfer in the CCD shift registers is performed under the supervision of a controller 14. The controller 14 provides clocking waveforms to a serial clock driver 16 and a parallel clock driver 18. Although the controller 14 would typically be constructed of either discrete logic circuits or gate array devices, the function of controller 14 may also be simulated by a personal computer having a clock generating board. The clock driver circuits are also located external to the semiconductor chip.

Synchronization and system control are maintained between the controller 14 and the clock drivers 16 and 18 via the master clock. The clock drivers condition the clocking waveforms provided by the controller 14 such that they are in synchronization with the master clock. A number of input buffer amplifiers 20 may also be used to improve the waveforms. As will be seen below, the parallel (interline) shift registers of the imaging array 12 are driven by two-phase clock lines $\phi_A$ and $\phi_B$, while the serial (output) registers are driven by the four-phase clock lines $\phi_1$, $\phi_2$, $\phi_3$, and $\phi_4$. Additional gating signals (not shown) are also applied to the imaging array under the supervision of controller 14.

Analog signals from each of the multiple imaging sections are buffered from external parasitics by output circuitry located on the semiconductor chip. In the preferred embodiment, the output circuitry is of a hybrid construction, being comprised of silicon (Si) and gallium arsenide (GaAs) field effect transistors. The analog voltage resulting from each charge packet is then routed off the chip to external amplifiers 22 where voltage amplification and further buffering occurs. Note that the output buffer amplifiers 22 must linearly track the analog charge transfer signals with precision. Finally, the analog signals from each of the imaging sections are applied to a number of high-speed analog-to-digital converters 24, and stored in a memory 26 for further data processing. A DC bias circuit 28 supplies the proper operating voltages to the imaging array.

Figure 2A:
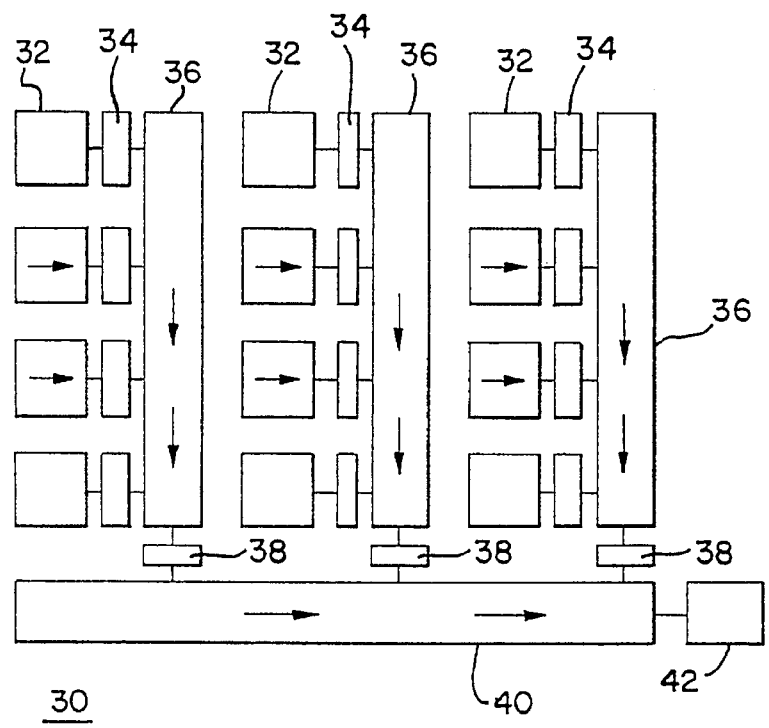
FIG. 2a is a simplified block diagram of an interline transfer type imaging array.

FIG. 2a is a simplified block diagram illustrating the interline transfer architecture for the imaging array 12. The interline transfer architecture is a preferred choice for large imaging arrays, due to its high yield and adaptability to high-speed clocking. Although the interline transfer architecture is used in the preferred embodiment, other architectures, such as frame transfer and/or horizontal/vertical scan generators, may also be used.

The interline transfer array 30 has been simplified to a 3×4 matrix for purposes of illustration. The imaging array 30 includes four rows of photodetectors 32, each connected by individual dump gates 34 to the interline transfer registers 36. When the proper gate voltage is applied to dump gates 34, the electrical charges accumulated in the photodetectors are simultaneously transferred from each row of the array into the interline transfer registers 36. The interline transfer registers 36 are typically constructed as buried channel CCD shift registers, all operating in parallel. A number of parallel-to-serial transfer gates 38 are coupled to the lower ends of the interline transfer registers. The parallel-to-serial transfer gates 38 are used to gate the charge packets from the interline transfer registers 36 into the serial output register 40. Since the serial output register 40 transfers the charge packets from a number of interline transfer registers operating in parallel, the serial output register 40 must operate at a much higher speed than the interline transfer registers 36. Some type of an output structure 42 is then used to transfer the charge packets from the serial output register 40, located on the semiconductor chip, to the output buffer amplifiers 22, located off the semiconductor chip.

Figure 2B:
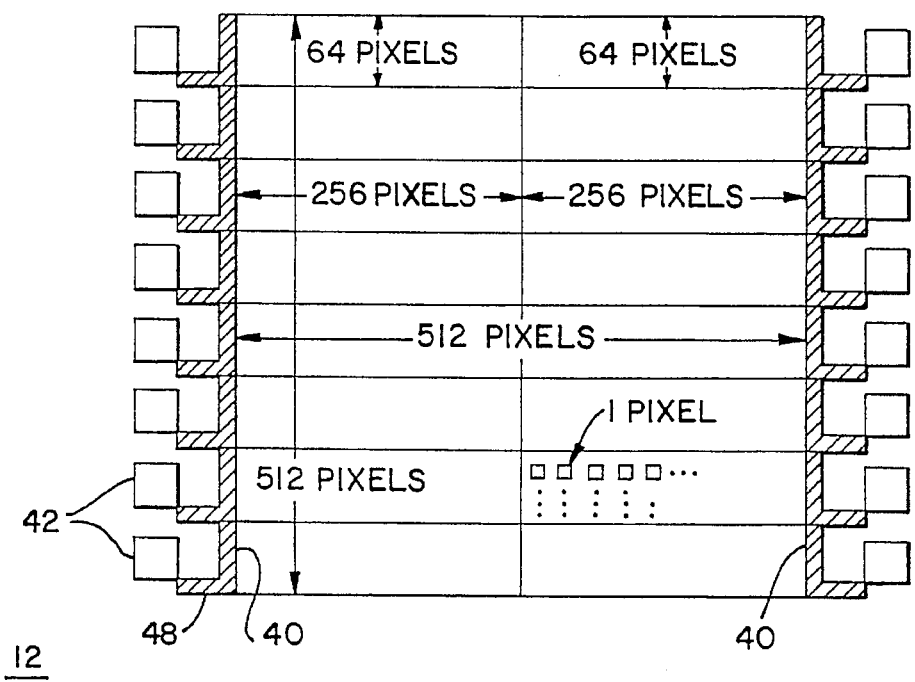
FIG. 2b is a pictorial representation of the imager arrangement of the present invention, showing the grouping of pixels with respect to the parallel output structures.

FIG. 2b illustrates the grouping arrangement of the pixels with respect to the output structures. The 512×512 imaging array 12 is segmented into sixteen sections, each section comprising an array of 64×256 pixels. In the preferred embodiment, the size of each pixel is 25×25 micrometers (μm). The charge packets from each of the photodetectors are transferred in parallel via 64 interline transfer registers (not shown) into the sixteen serial output registers 40. Four-phase clocking is then used to serially output these analog signals through branch 48 of the output registers to one of the sixteen output structures 42. As will be explained in detail below, the preferred embodiment of imaging array 12 has the serial output registers 40 constructed of peristaltic CCDs, and each branch 48 of the serial output register 40 has a floating gate and a silicon preamplifier to which a GaAs FET output circuit is bump-mounted. The use of peristaltic CCDs and GaAs FETs allows for very high-speed data output.

By segmenting the imaging array 12 into sixteen sections, the time required to output a frame of data from the entire array is equivalent to the time required to output data from only one section of the imager. For example, for a section having 64×256 pixels, and operating each serial output register at 164 million samples-per-second (Megasamples/sec), a composite frame rate of 164,000,000÷64 rows÷256 columns=10,000 fps is achieved. Moreover, since the CCD imager is operated without surface carrier inversion (as is required for virtual-phase CCD operation), the instantaneous current requirement for the parallel clock drivers is less than 1 ampere. If ultrahigh frame rate operation is required, the imager can be designed to incorporate additional output structures. For example, if a total of 64 output structures were used, clocking the interline transfer registers at 5 MegaHertz (MHz) and the serial output register at 90 MHz, a frame rate of approximately 22,000 fps can be achieved.

Figure 2C:
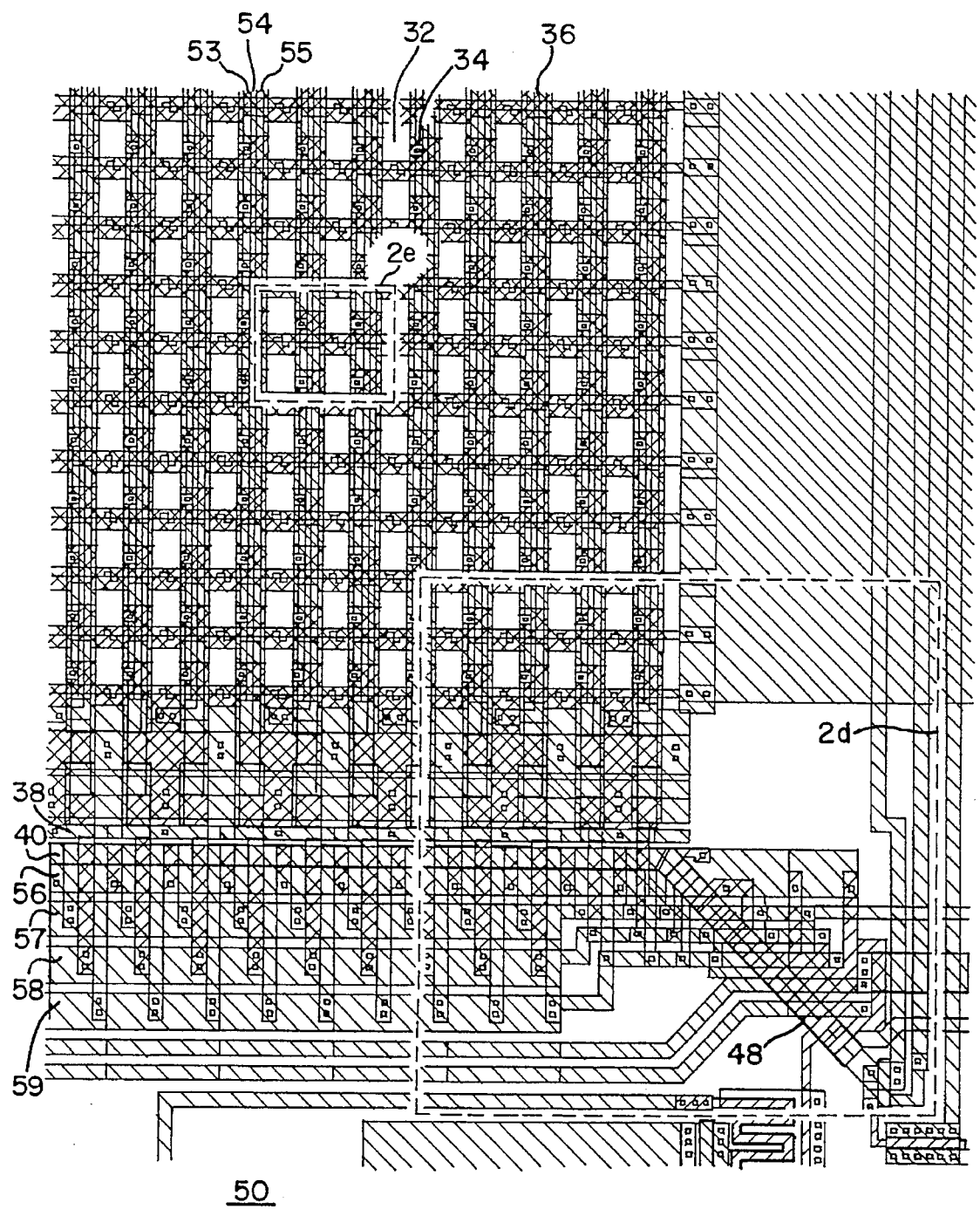
FIG. 2c is a plan view of a 10×10 pixel section of the imaging array of the present invention.
Figure 2D:
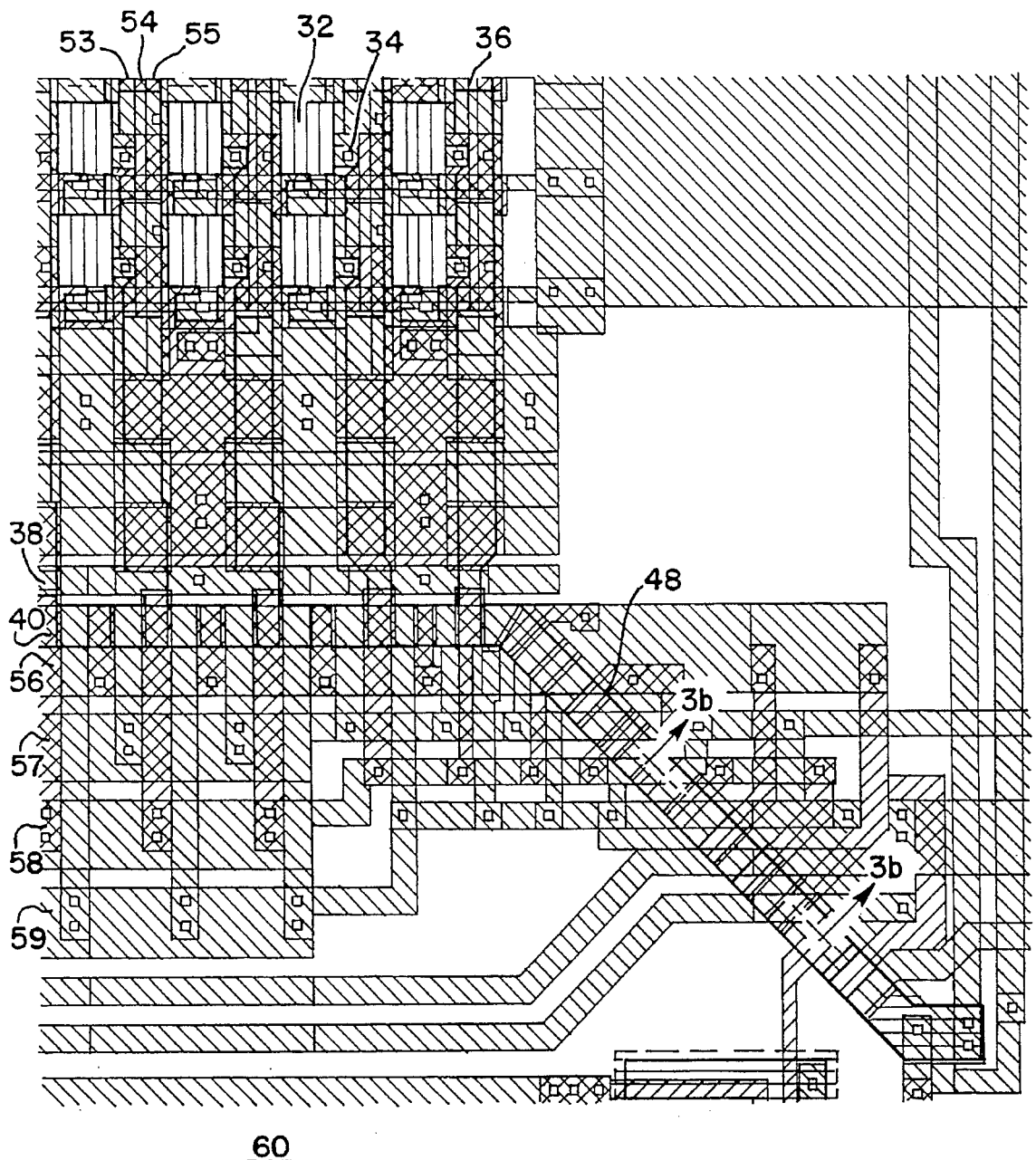
FIG. 2d is an enlarged plan view of a 2×4 pixel section of the imaging array of FIG. 2c, showing a portion of the serial output register.
Figure 2E:
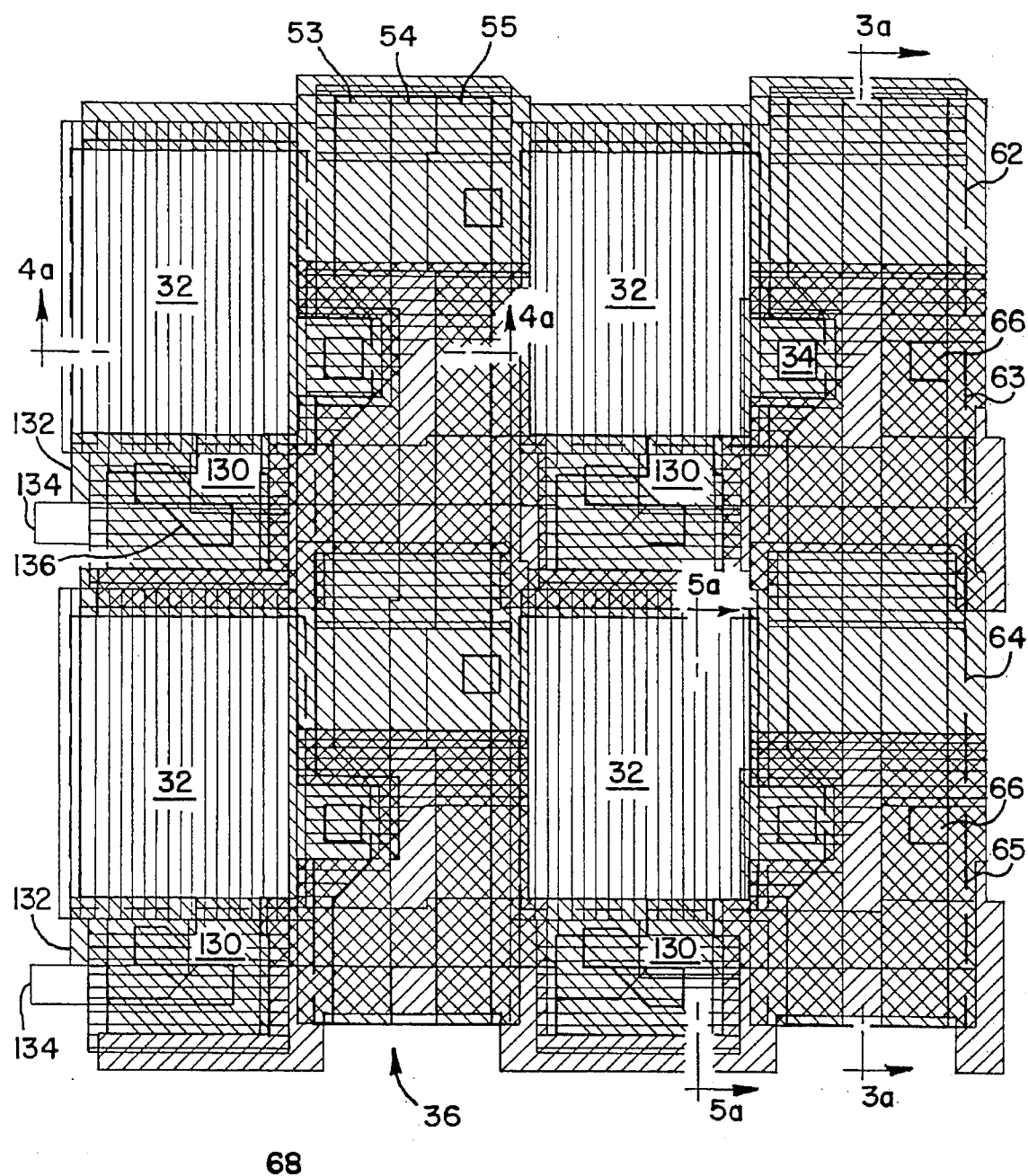
FIG. 2e is an enlarged plan view of a 2×2 pixel section of the imaging array of FIG. 2c, showing a portion of the interline transfer register.

FIG. 2c illustrates a 10×10 section 50 of imaging array 12 of FIG. 1. FIGS. 2d and 2e, described below, provide enlarged representations of the areas shown in dashed lines. From FIG. 2c, it can be seen that each pixel includes the photodetector 32, the dump gate 34, and a portion of the interline transfer register 36. The interline transfer register extends vertically along one side of each of the photodetectors as shown. Each interline transfer register 36 is clocked by $\phi_A$ and $\phi_B$ clock signals via clock lines 54, 55, respectively, and the dump gate 34 is controlled by dump signal $\phi_D$ through dump line 53. The parallel-to-serial transfer gate 38 is shown at the bottom of the array. The four clock lines 56, 57, 58, and 59, for the serial output register 40, provide the four-phase clocking signals $\phi_1$, $\phi_2$, $\phi_3$, and $\phi_4$.

FIG. 2d is an enlarged representation of the lower section (shown in dashed lines in FIG. 2c) of the imaging array 12. This figure illustrates a 2×4 pixel section 60 of the array (in the upper left corner), and one branch 48 of the serial output register 40 (in the lower right corner).

FIG. 2e is an enlarged representation of the upper section (shown in dashed lines in FIG. 2c) of the imaging array 12, illustrating a 2×2 pixel section 68 of the array. Again, it can be seen that the photodetector 32 occupies much of the area of each pixel. As explained above, the charge packets are transferred out of the photodetector 32 when an appropriate $\phi_D$ signal is applied to dump gate 34 via dump line 53. The charge packet is then transferred into the interline transfer register 36. Polysilicon gates 62, 63, 64, and 65 are arranged adjacent to each other to form a four-gate section of the interline transfer register CCD. Alternate gates of the register 36 are connected to either metal clock line 54 or 55 via contact areas 66. In the preferred embodiment, clock lines 54 and 55 are constructed of aluminum, and have a current handling capacity of approximately 1 milliamp-per-square μm. Since a peak current of about 6 milliamps per metal line is required, the width of each of the clock lines 54, 55 is at least 6 μm. (The layout of the clock lines have been simplified in this figure for purposes of illustration.)

Figure 3A:
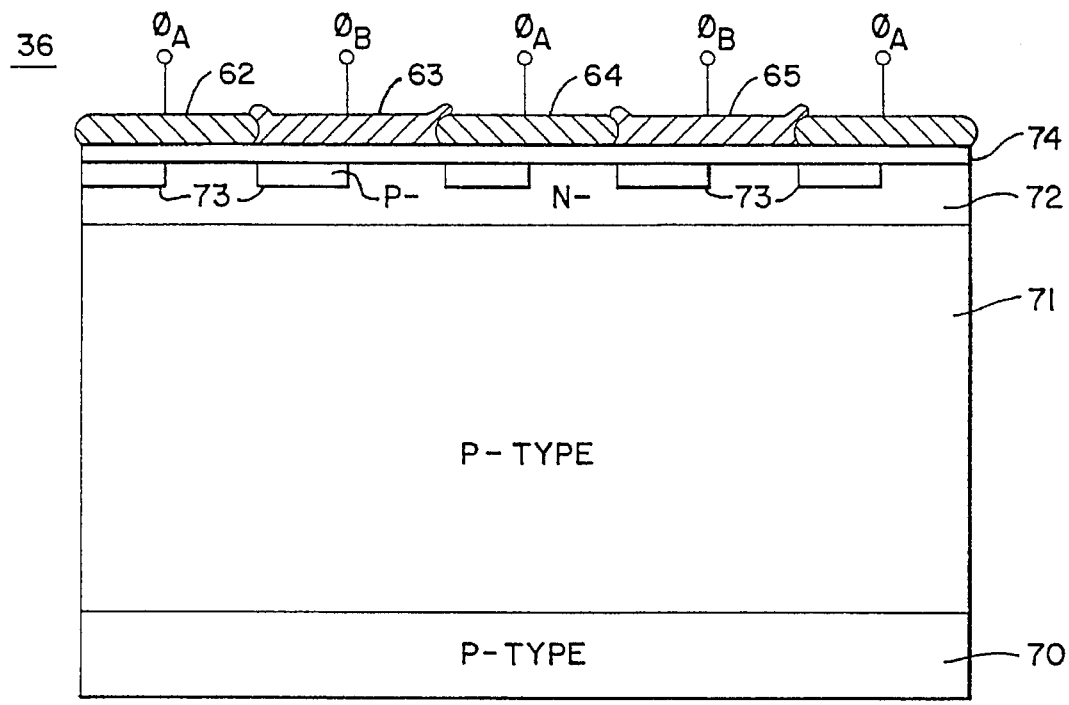
FIG. 3a is a cross-sectional view of the interline transfer register CCD, taken along the lines 3a—3a of FIG. 2e.

FIG. 3a is a cross-sectional view of the interline transfer register 36 taken along the line 3a—3a of FIG. 2e. In one embodiment of the present invention, the interline transfer register 36 is constructed in accordance with buried channel CCD technology. The CCD backside substrate 70 is comprised of a single carrier-type semiconductor material, such as P-type single crystalline silicon, having a resistivity in the range of 0.01–0.02 ohm-centimeter (Ω-cm). A P-type epitaxial layer 71 is grown on the heavily-doped backside substrate 70. The epitaxial layer 71 has a resistivity in the range of 30–40 Ω-cm. Both the backside substrate 70 and the epitaxial layer 71 will be generally referred to below as the substrate.

A buried channel implant 72, formed by diffusing a light doping of an opposite carrier-type material (shown as N−) into the (P-type) silicon substrate, extends below the surface of the semiconductor. A threshold adjust implant 73 is formed by diffusing a light doping of the same type (P-type) material (shown as P−) into the substrate after the buried channel implant 72 has been formed. A silicon-dioxide dielectric layer 74 is then grown on the semiconductor surface before the CCD polysilicon gates 62, 63, 64, 65 are applied. Finally, metalization (not shown) for the clock lines is applied and connected to the polysilicon gates via contacts 66 as known in the art.

Figure 3B:
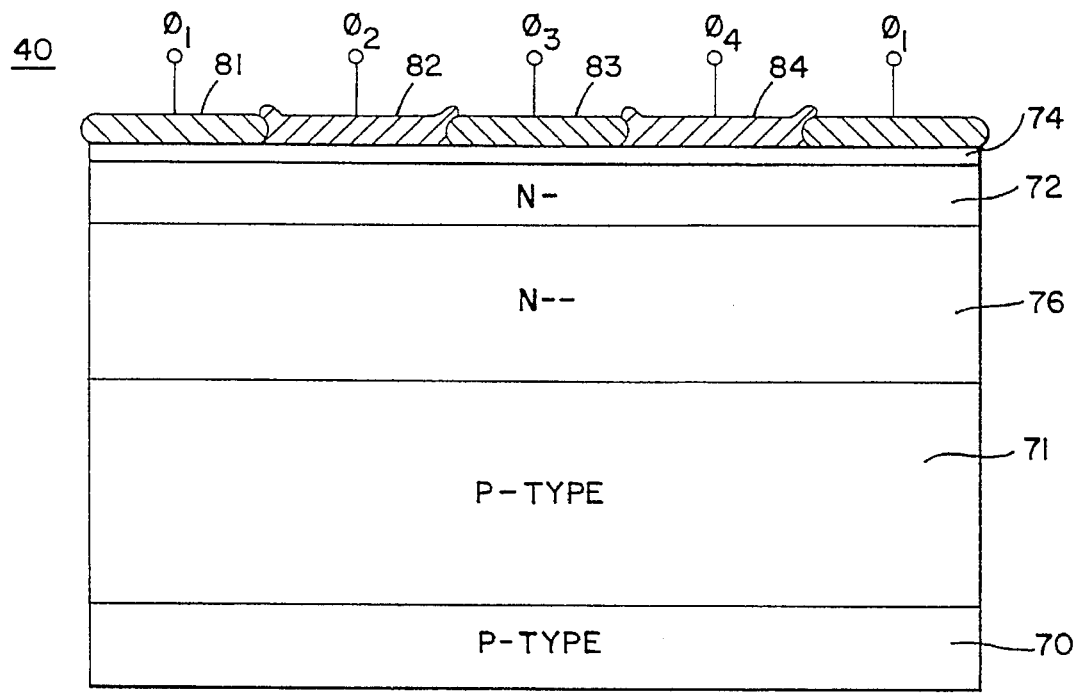
FIG. 3b is a cross-sectional view of the serial output register CCD, taken across the lines 3b—3b of FIG. 2d.

FIG. 3b illustrates a cross-section of a branch of the peristaltic CCD output shift register 40, shown taken along the lines 3b—3b of FIG. 2d. The peristaltic CCD is fabricated by means of two or more ion implantation steps, as distinguished from a single implant in a buried channel CCD. The peristaltic CCD is characterized by a more highly-concentrated implant that is relatively shallow, and a lighter implant that is relatively deep. In other words, the peristaltic CCD structure exhibits a buried channel structure with an additional deep implant. Hence, a peristaltic CCD is a specialized type of a buried channel CCD.

As used herein, the notation "N–" refers to an N-type semiconductor material having an impurity concentration which is less than, i.e., lighter than, the impurity concentration of an N-type semiconductor substrate, denoted as "N". Similarly, the notation "N––" refers to an N-type semiconductor material having an impurity concentration which is lighter than that of an N– semiconductor material. Conversely, the notation "N+" denotes a heavier impurity concentration than that of an N substrate Finally, the notations "P", "P–", "P––", and "P+" denote the same relative impurity concentrations as explained above, except using P-type semiconductor material.

Still referring to FIG. 3b, the peristaltic CCD output shift register 40 may be manufactured in accordance with the following steps:

(1) A semiconductor substrate (epitaxial layer 71 and backside substrate 70) of a first conductivity type (P-type for example) is implanted with a very light dosage of an opposite conductivity type material 76 (N–– for example). In the preferred embodiment, a phosphorus dose of approximately $4 \times 10^{11}$ N-type impurities is implanted at 180,000 electron volts into a P-type substrate having an epitaxial layer 71 with a resistivity in the range of 30–40 Ω-cm.

(2) The substrate is then heated such that the first implant diffuses down into the semiconductor to form the peristaltic layer 76. In the preferred embodiment, the substrate is heated at approximately 1150° C. for approximately 15 hours to diffuse the N– implant 76 deep into the silicon substrate. After heating, the peristaltic implant 76 will extend to a depth ranging from 1 to 5 μm from the semiconductor surface, but typically extends 2 to 3 μm deep. The N–– peristaltic implant 76 will then have a very light impurity concentration on the order of $1 \times 10^{15}$ impurities/cubic centimeter (cc).

(3) A second implant of a heavier concentration of the same conductivity type material (N– for example) as the first implant is implanted to form the buried channel layer 72. In the preferred embodiment, a phosphorus dose of approximately $1.4 \times 10^{12}$ N-type impurities is implanted at 180,000 electron volts for this step.

(4) The substrate may again be heated such that the second implant diffuses into the substrate. The depth of the buried channel implant 72 may range from 0.2 to 1 μm below the semiconductor surface, but is typically 0.5 μm deep. The N– buried channel implant 72 would then have an impurity concentration of approximately $1 \times 10^{16}$ impurities/cc, which is heavier than the N–– peristaltic implant 76. Note that this second heating step may be combined with other heating or annealing processes.

(5) In an interline transfer register CCD, such as that shown in FIG. 3a, a third implant of a light concentration of the opposite conductivity type material (P– for example) as the first implant is selectively implanted to form the threshold adjust implants 73 under a portion of each of the polysilicon gates. (Threshold adjust implants 73 are not required to be used in the serial output register CCD shown in FIG. 3b.) Since the charge packets are being shifted from left-to-right in FIG. 3a, the threshold adjust implants 73 lie under the left half of each of the polysilicon gates. In the preferred embodiment, a boron dose of approximately $5.75 \times 10^{11}$ P-type impurities is implanted at 60,000 electron volts to form an implant depth of approximately 0.2 μm. Again note that an additional heating step may be used, or the heating steps may be combined with other heating or annealing processes.

(6) Silicon-dioxide is then grown on the surface of the semiconductor to form the dielectric layer 74. In the preferred embodiment, the thickness of the dielectric 74 is approximately 800 Angstroms.

(7) Finally, a number of polysilicon gates 81, 82, 83, 84 are then applied on top of the dielectric 74 and attached to the appropriate metalization (not shown) for the clock lines. In the preferred embodiment, the thickness of the polysilicon gates are approximately 8,000 Angstroms.

The use of the peristaltic implant 76 places the potential well maximum deeper in the silicon, so that charge packets are stored deeper. As such, the lateral electric field drive is stronger, which greatly assists the ability to clock the serial output registers at a higher rate. Note that the optimum depth of the peristaltic implant is a function of the width of the CCD gate. In the preferred embodiment, the CCD gates are 5 μm wide, and the peristaltic implant is approximately 2–3 μm deep. However, a gate having a width of 1 μm would require a much more shallow peristaltic implant. Note also that since the imaging array 12 preferably utilizes the interline transfer architecture, there is no need to make the interline transfer registers 36 from a peristaltic CCD. Recall that the interline transfer registers 36, using this architecture, do not operate at the same speed as the serial output shift register 40. However, in some applications, particularly if the interline transfer architecture is not used, it may prove beneficial to construct all the imager shift registers as peristaltic CCDs.

Figure 3C:
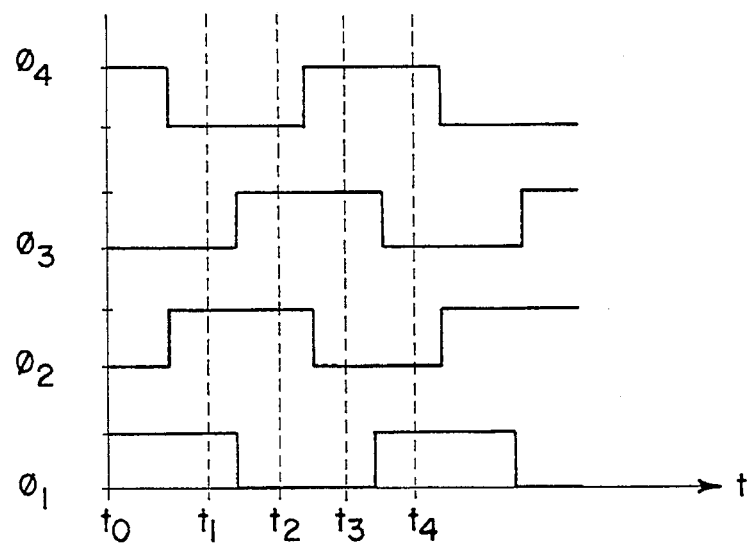
FIG. 3c illustrates timing diagrams for the four phases of the clock signals for the serial output register CCD shown in FIG. 3b.

FIG. 3c illustrates timing diagrams for the four phases of the clock signals used with the serial output register 40 shown in FIG. 3b. The CCD gates 81, 82, 83, and 84 have clocking signals selectively applied to them in four phases, $\phi_1$, $\phi_2$, $\phi_3$, and $\phi_4$, to transfer the charge packets toward the output structure 42 of the CCD. The clock signals at four instants of time, $t_1$, $t_2$, $t_3$, and $t_4$, will be discussed next.

Figure 3D:
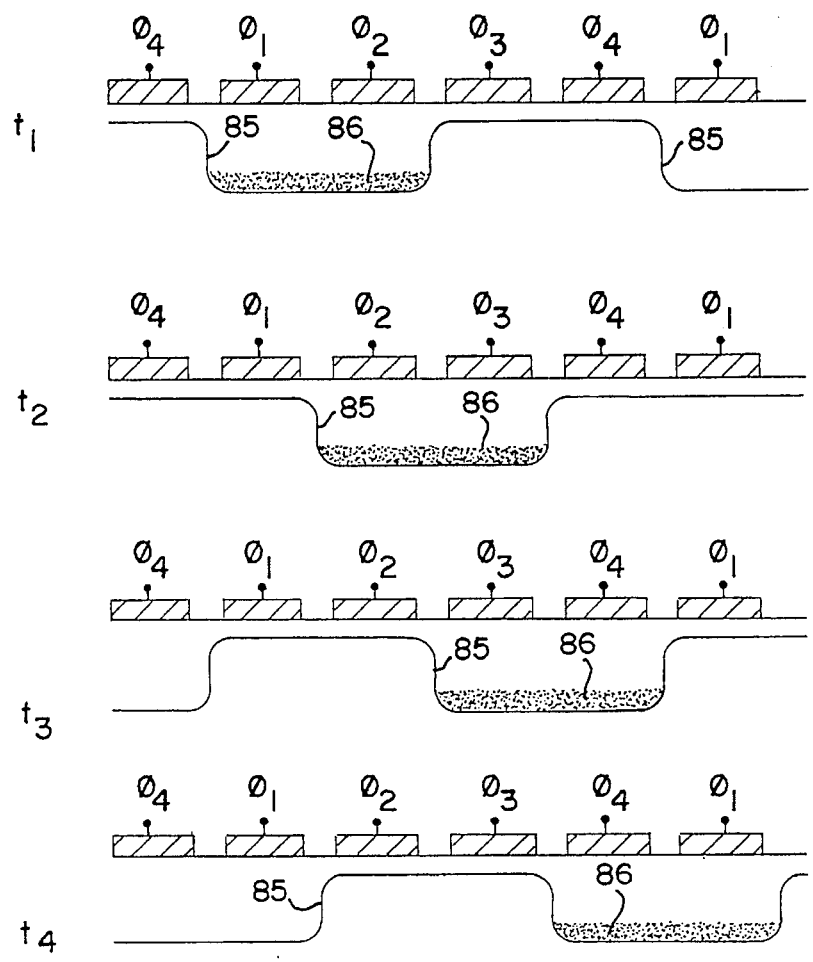
FIG. 3d is a pictorial representation of the potential well profiles for the serial output register CCD shown in FIG. 3b using the timing diagrams of FIG. 3c.

FIG. 3d is a pictorial representation of the potential well profiles for the serial output register CCD shown in FIG. 3b using the timing diagrams of FIG. 3c. At time $t_1$, clock signals $\phi_1$ and $\phi_2$ are high, such that a potential well 85 is formed for storage of charge 86 under the first two gates. At time $t_2$, clock signal $\phi_1$ has gone low and clock signal $\phi_3$ has gone high, such that the change in the potential well 85 has shifted the charge packet 86 to the right as shown. At times $t_3$ and $t_4$, the charge packet is shifted further to the right in a similar manner. Note that the charge packets are not located at the semiconductor surface in a peristaltic CCD.

Figure 4A:
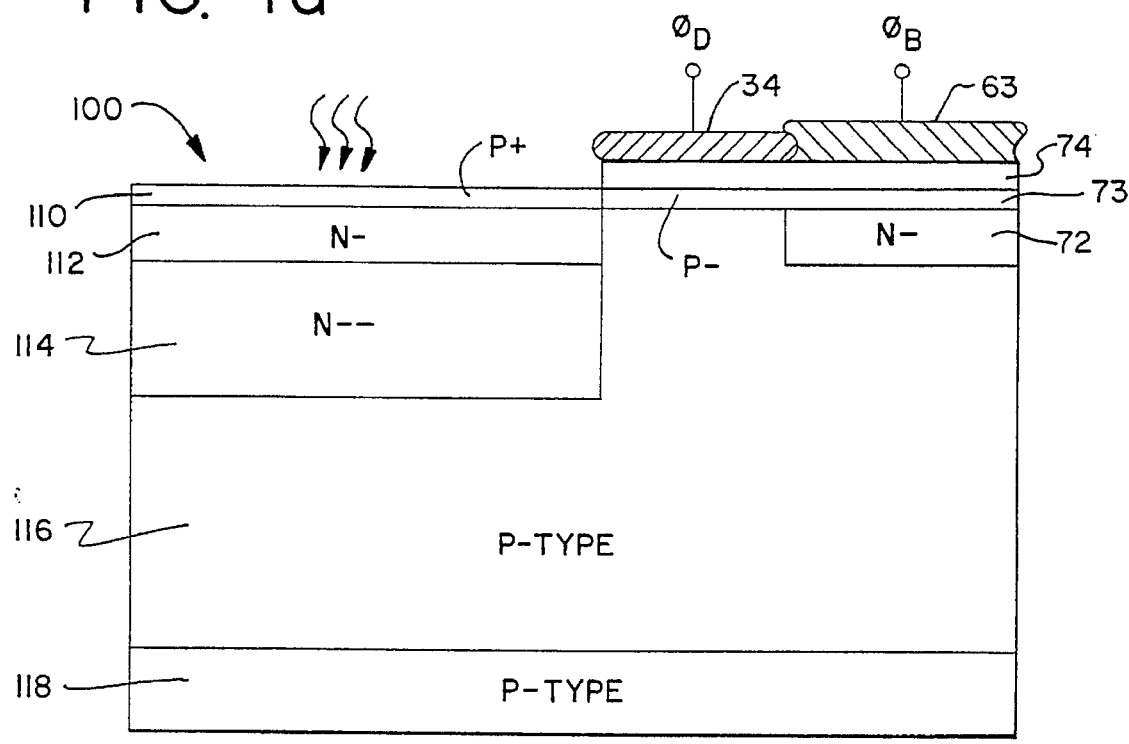
FIG. 4a is a cross-sectional view of a single pixel taken along lines 4a—4a of FIG. 2e, showing the pinned photodiode structure of the present invention.

FIG. 4a is a cross-sectional view of a single pixel taken along lines 4a—4a of FIG. 2e. In the preferred embodiment, each photodetector 32 is a type of pinned photodiode 100 as shown in FIG. 4a. The term "pinned" refers to the pinning or tying of the photodiode surface to the substrate potential. The pinned photodiode 100 includes an additional P+ layer 110 formed at the surface of the N-type region. Since the P+ region is in direct contact with the P-type channel stop diffusions (not shown here) about the periphery of the photodiode, the P+ layer is electrically connected to the P-type substrate potential.

In the preferred embodiment, the N-type layer of the pinned photodiode is formed as a two-layer region in much the same manner as the peristaltic CCD. The four-layer pinned photodiode 100 has an N- implant layer 112 with a deeper N—— implant layer 114, both implanted into a P-type substrate comprising an epitaxial layer 116 and a backside substrate 118. The addition of the fourth layer, i.e., the N—— implant 114, which is more lightly doped in the four-layer pinned diode 100 than the N– implant 112, the depletion region is larger, and a higher quantum efficiency is achieved. Moreover, due to the two-layer construction of the N– implant layer of the four-layer pinned photodiode 100, the development of lateral fields across the diode is possible, which help to sweep the charge out quickly. Hence, while the four-layer pinned photodiode offers all of the advantages associated with the conventional P-N junction photodiode, it also offers greatly reduced image lag and lower interface noise.

More specifically, the four-layer pinned photodiode 100 is made from a semiconductor substrate preferably having P-type conductivity, and typically having an epitaxial layer 116 with a resistivity in the range of 30–40 Ω-cm. A first implant layer 114, preferably of N-type conductivity (shown as N——), is implanted into the P-type substrate. The substrate is then heated, as described above, to diffuse the N—— impurities deeply into the substrate. A second N-type implant is then used to form the N– layer 112 for the photodiode 100, as well as the N– layer 72 under the interline transfer register gate 63 as shown. The first and second implants 114 and 112 may be made using the same impurity types and implant voltage levels as those used for implants 76 and 72, respectively. Preferably, the depth of the N—— implant 114 is 2 to 3 μm below the surface of the semiconductor, while the depth of the N– implant 112 is on the order of 0.5 μm. Furthermore, the N– implant 112 would have an impurity concentration on the order of $1 \times 10^{16}$ impurities/cc, while the N—— implant 114 would have a much lighter concentration of approximately $1 \times 10^{15}$ impurities/cc. Finally, a highly conductive P-type implant 110 (shown as P+) is disposed on top of implant 112. The P+ implant 110 is made by doping the silicon substrate with a very heavy concentration of boron, i.e., on the order of $5 \times 10^{12}$ P-type impurities, implanted at approximately 21,000 electron volts. The P+ implant 110 has a depth on the order of 200 Angstroms, and an impurity concentration on the order of $4 \times 10^{17}$ impurities/cc. A lighter P– implant 73 of boron may also be located under the dump gate 34 and/or the interline transfer gate 63 to adjust the threshold of these devices. Note that the four-layer pinned photodiode can conveniently be made at the same time, and using the same processes and impurity concentrations, as the peristaltic CCD of FIG. 3b.

Figure 4B:
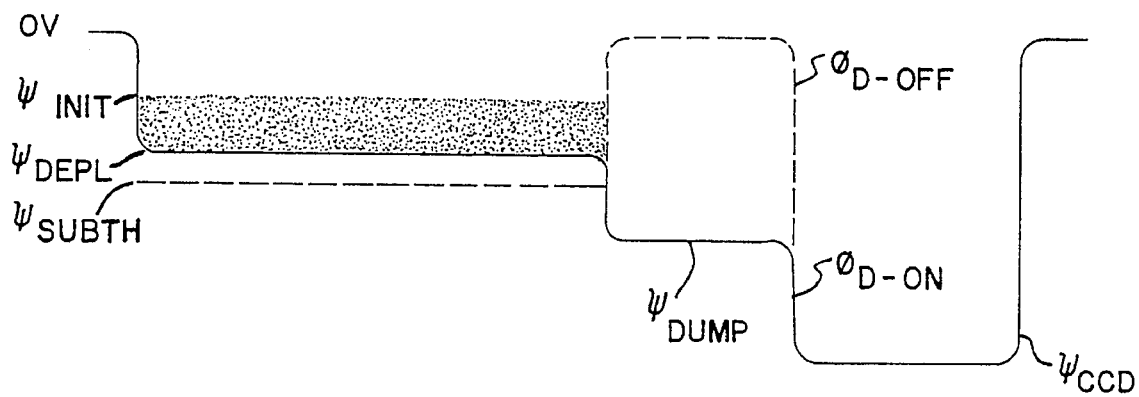

FIG. 4b is a pictorial representation of the potential profiles of the pinned photodiode of FIG. 4a. When light strikes the photosite and signal electrons have accumulated in the photodiode, the photodiode potential will initially be at a low level $\psi_{INITIAL}$. Moreover, the potential profile $\psi_{DUMP}$ under the dump gate 34 will be high when no signal is applied to the dump gate, i.e., $\phi_{D-OFF}$. When the dump gate is turned on, $\phi_{D-ON}$, signal electrons are carried from the photodiode to the CCD. Note that the CCD potential $\psi_{CCD}$ under the interline transfer register gate 63 is sufficiently low as compared to the dump gate potential $\psi_{DUMP}$. In the pinned photodiode, the donor concentration of the N-type region of the photodiode is lowered such that the photodiode potential $\psi_{DEPL}$ necessary for depleting the entire N-type region may be smaller than the potential of the subthreshold $\psi_{SUBTH}$. In other words, the P+ layer 110 of the pinned photodiode prevents the silicon/silicon-dioxide interface from being entirely depleted. Thus, $\psi_{DEPL}$ remains greater than $\psi_{DUMP}$. Accordingly, all the signal electrons can be completely transferred before the subthreshold condition begins. As a result, the time required to transfer all of the electrons out of the photosite is shortened significantly.

Moreover, the four-layer pinned photodiode of the present invention improves the quantum efficiency of the device. At the shorter wavelengths, the photon energies are very high, yielding high quantum efficiencies for either thick or thin depletion regions. The high quantum efficiency at the shorter wavelengths is typically impaired by multiple reflections near the silicon/silicon-dioxide interface. However, the four-layer pinned photodiode of the present invention has no silicon dioxide or polysilicon covering and thus passes a large percentage of the incident light. Longer wavelength photons are also captured more efficiently because of the lightly-doped layer 114 having a deeper depletion region which permits the longer wavelength photons to generate free electrons over a longer path.

The imager structure of one embodiment of the present invention further includes antiblooming capabilities which can also serve the function of electronic shuttering. Many times, high-speed imaging requires the ability to take a picture in a very short time frame, i.e., high-speed shuttering. The ability to high-speed shutter enables the imager to photograph high-speed motion without blurring. One method of achieving high-speed shuttering is to increase the frame rate of the imager. However, for shutter speeds on the order of one microsecond, a frame rate of 1/1 μsec or one million fps would required. This requirement not only creates a nearly impossible design task, but also results in enormous amounts of unnecessary data being read from the imager chip just in order to achieve the high shutter rate. The present invention achieves the required high-speed shuttering effect through the use of on-chip antiblooming. This permits "freeze-frame" pictures of high-speed motion without increasing the frame rate of the imaging system.

Again referring to FIG. 2e, it can be seen that each pixel has an antiblooming drain 130 and an antiblooming gate 132. The antiblooming gate 132 is constructed of polysilicon, and is connected to an antiblooming gate signal line 134 via a contact 136. The control of the antiblooming gate 132 will be explained in detail below.

Figure 5A:
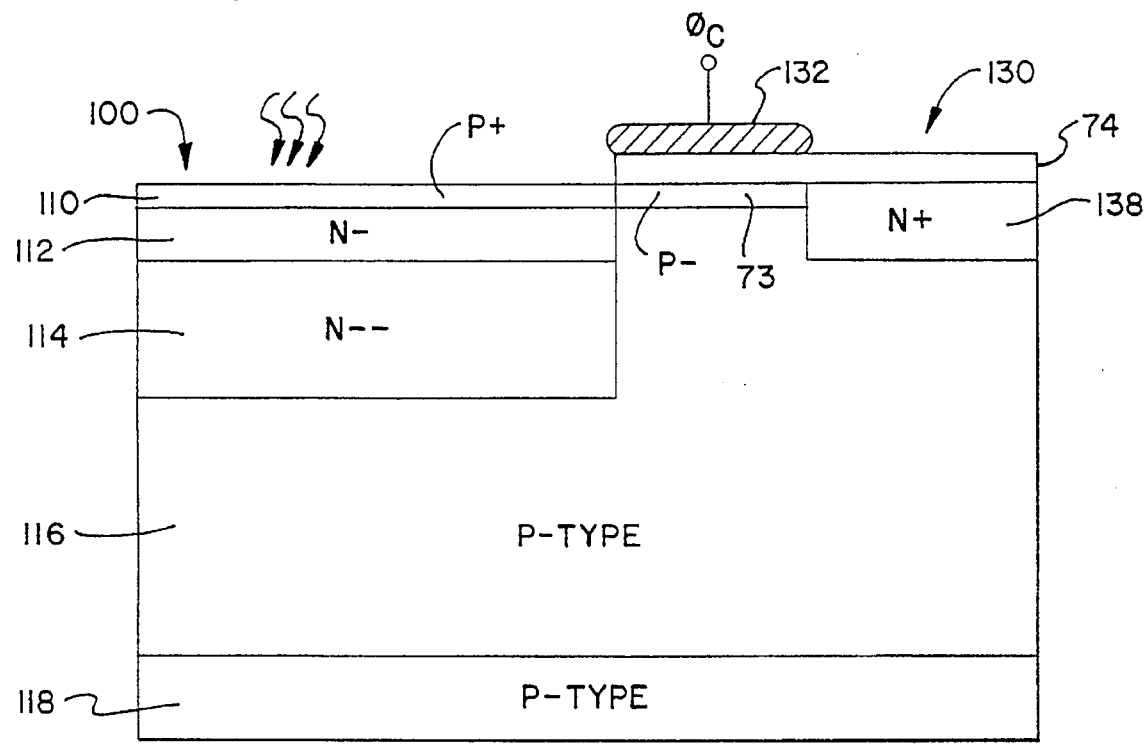
FIG. 5a is a cross-sectional view of a single pixel taken along lines 5a—5a of FIG. 2e, showing the structure of the antiblooming drain.

FIG. 5a illustrates a cross-sectional view of a single pixel taken along lines 5a—5a of FIG. 2e, showing the structure of the antiblooming drain 130 and the antiblooming gate 132, without the metalization. The antiblooming drain 130 is comprised of a single N+ implant 138. Preferably, the depth of the N+ implant 138 is approximately 0.3 μm below the surface of the semiconductor, and has an impurity concentration on the order of $4 \times 10^{18}$ impurities/cc. The N+ implant 138 is made by doping the silicon substrate with a very heavy concentration of arsenic, i.e., on the order of $5 \times 10^{15}$ impurities, implanted at approximately 180,000 electron volts. Since the N+ implant 138 is electrically connected through the silicon dioxide layer 74 to contact metalization (not shown here), the charge swept into the antiblooming drain 130 is discharged via the metalization.

Figure 5B:
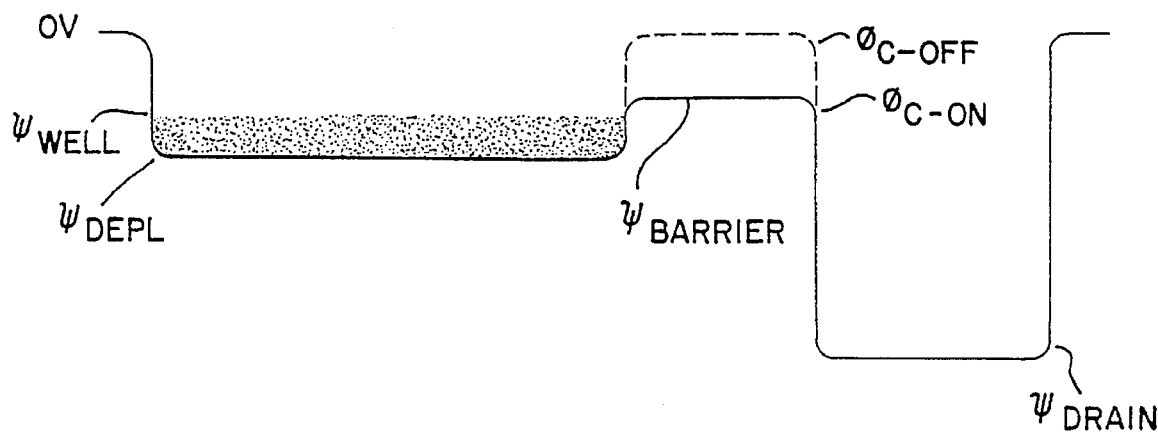

FIG. 5b is a pictorial representation of the potential well profiles for the pixel shown in FIG. 5a. As previously mentioned, saturation occurs when an excess amount of integrated charge fills the photosite collection well of the photodiode 100, whereby its potential $\psi_{WELL}$ becomes low enough to allow charge spillage into the wells of neighboring pixels. This spillage effect normally causes the images of bright objects to bloom or spread and appear as a large bright spot of light when they are subsequently displayed.

One known solution to the blooming problem is to collect the excess charge in the antiblooming drain 130, which normally serves as an overflow drain. In prior devices, the antiblooming gate would be biased at a constant DC potential such that the operation of the imager is only affected if and when the integrated charge level in the photosite reaches the DC biased level of the potential barrier, or $\psi_{BARRIER}$, of the antiblooming gate. If this level is reached in any pixel, any additional integrated charge from that pixel will be swept over the barrier and into the antiblooming drain, biased at $\psi_{DRAIN}$. In contrast, the present invention can be operated in a mode which dynamically varies the potential $\psi_{BARRIER}$ of the antiblooming gate to provide an imager structure having antiblooming capabilities which can also serve the function of an optical shuttering device. In the preferred embodiment, the antiblooming control is performed in a dynamic fashion by the use of an antiblooming gate signal $\phi_C$ applied to the antiblooming gate 132. It will be apparent to those skilled in the art that the absolute voltage levels of the potential $\psi_{BARRIER}$ can be adjusted for each of the antiblooming gate signal levels, $\phi_{C-OFF}$ and $\phi_{C-ON}$.

Figure 5C:
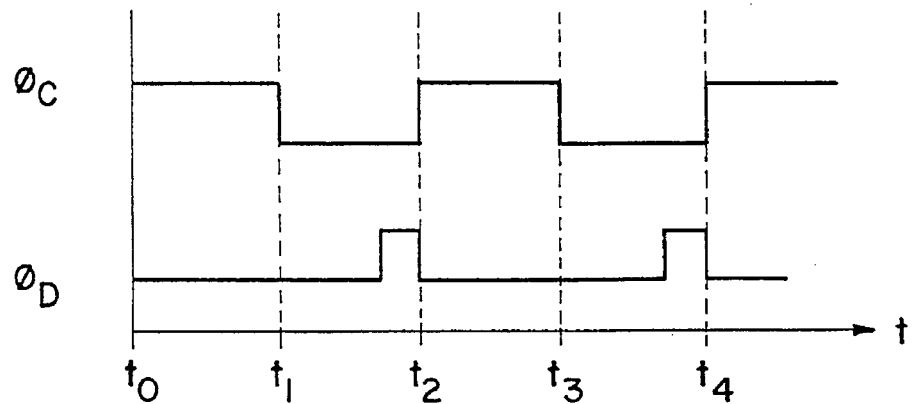

FIG. 5c illustrates timing diagrams for the antiblooming gate signal $\phi_C$ and the dump gate signal $\phi_D$ for operating the antiblooming gate 132 to perform the function of electronic shuttering of the CCD shown in FIG. 5a. The frame rate of the imager is measured by the falling edge of the dump gate signal $\phi_D$. Hence, in FIG. 5c, the frame rate is $1/(t_2-t_0)$ or $1/(t_4-t_2)$. By adjusting the pulse width of the $\phi_C$ signal applied to the antiblooming gate 132, the charge collected in the photosite may selectively be discharged into the antiblooming drain 130 during a "shutter-closed" period, i.e., $t_0-t_1$ or $t_2-t_3$. Charge is collected at the photosite in the normal manner during a "shutter open" period, i.e., $t_1-t_2$ or $t_3-t_4$, and the image is stored when the dump gate signal $\phi_D$ is activated. Therefore, by adjusting the pulse width of the antiblooming gate signal $\phi_C$, the present invention can achieve variable shutter rates without affecting the inherent frame rate of the imager.

Figure 6D:
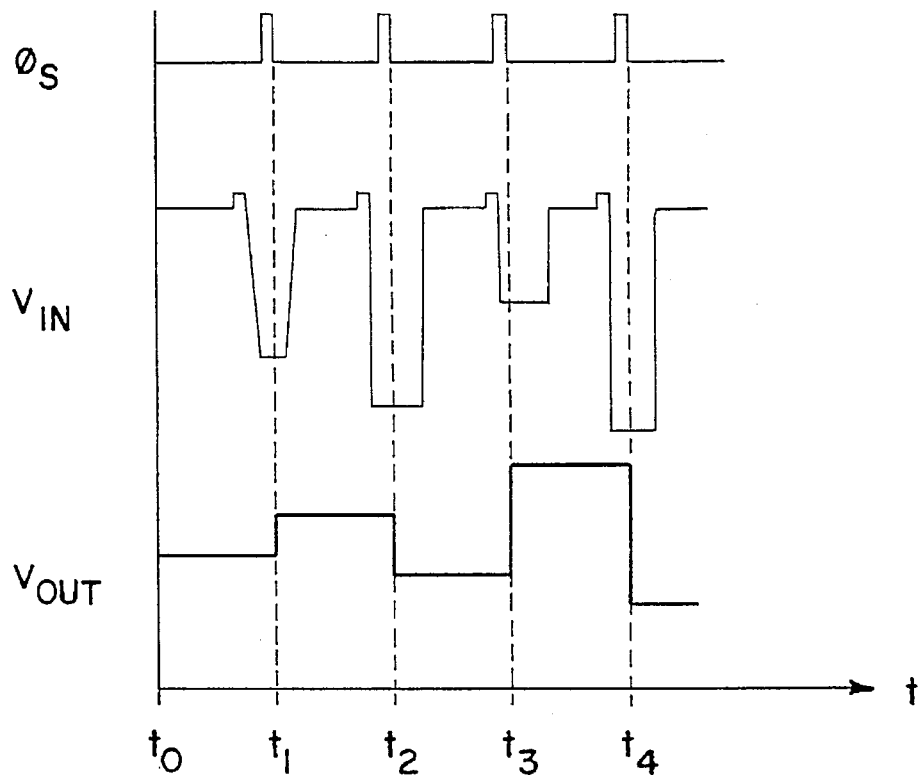
FIG. 6d illustrates timing diagrams for the sample-and-hold circuitry in accordance with the present invention.
Figure 6A:
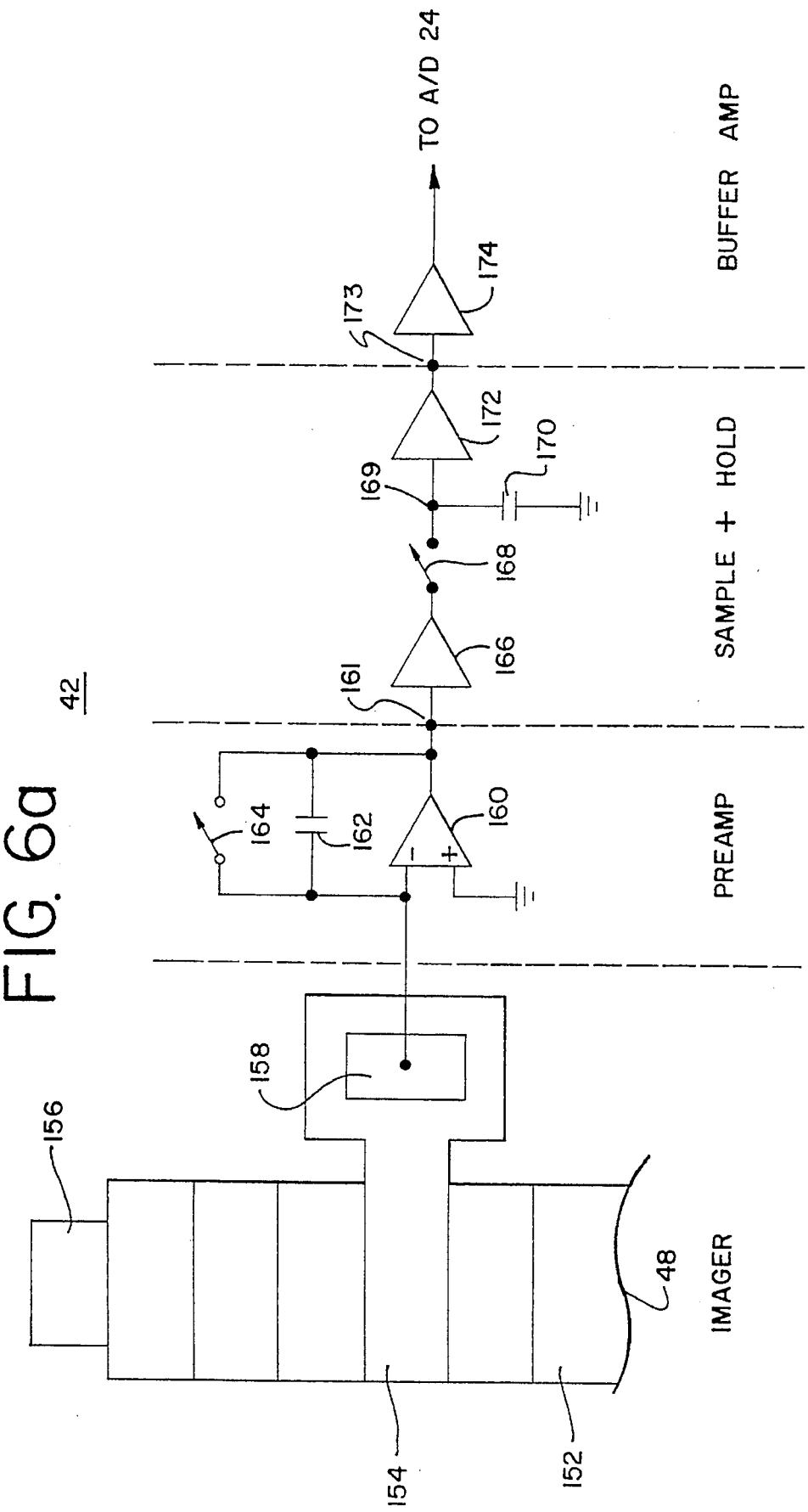
FIG. 6a is a general block diagram of the output structure for the CCD imaging array of the present invention.

FIG. 6a is a block diagram of the output circuitry 42 for the imaging array 12 of the present invention. A floating-gate output configuration is used, such that the charge packet is sensed is a nondestructive manner. A portion of the output branch 48 of the serial output register 40 is shown in the Figure as having a number of polysilicon gates 152, a floating gate 154, and a sink diode 156. Diode 156, consisting of a heavily-doped N+ implant, serves to remove the remainder of the charge packet from the CCD. The floating gate 154 extends out from the CCD body over the silicon semiconductor substrate to a contact point 158. This is done for two reasons. First, the gate oxide isolation will eliminate any substrate current noise coupling to the GaAs portion of the output amplifier. Second, the complete isolation of the GaAs output structure from the silicon substrate allows for very fast reset and sample-and-hold functions to be integrated on chip. Present silicon MOS technology allows for reset speeds of about 20 MHz. However, using GaAs FET technology, the reset speeds can be increased up to 100 MHz. Hence, the use of peristaltic CCDs in combination with GaAs FET output devices allows for very high-speed data output.

As seen in FIG. 6a, the output circuitry 42 includes a preamplifier section, a sample-and-hold section, and a buffer amplifier section. The preamplifier section is comprised of an amplifier 160 having capacitive feedback provided by feedback capacitor 162. The use of capacitive feedback greatly reduces the gain and offset variations normally associated with multiple output CCD imagers. A reset switch 164 is also provided across the preamplifier to reset the floating gate voltage to zero. The sample-and-hold section of the output circuitry 42 is comprised of a buffer amplifier 166, a sampling switch 168, a holding capacitor 170, and a sample-and-hold amplifier 172. The sample-and-hold circuit provides the A-to-D converter with more time to acquire data. Finally, the buffer amplifier stage is comprised of a single-stage amplifier 174, which could serve as the output buffer amplifiers 22 of FIG. 1. The analog output signal from the CCD is then applied to the A-to-D converter 24 (FIG. 1).

In the preferred embodiment, the preamplifier section and the sample-and-hold section are physically located on the semiconductor chip, while the buffer amplifier 174 is located off-chip on a printed circuit board. Furthermore, in the preferred imager implementation, the preamplifier section is comprised of silicon FET devices on-chip, and the sample-and-hold section is constructed of GaAs FETs which have been bump-mounted to the silicon substrate at node 161. The operational bandwidth of gallium arsenide transistors is much greater than that of silicon MOS transistors, perhaps by a factor of three. The utilization of GaAs FETs as output devices provides the imager with a sampling rate of 180 Megasamples/sec, which would otherwise be reduced to approximately 30 Megasamples/sec for silicon output transistors. The combination of silicon preamplifier FETs and GaAs FET output devices eliminates the inherent bandwidth limitation of silicon MOS transistors, while circumventing the fundamental problem of trying to grow an oxide on GaAs which would be needed to form a high input impedance FET preamplifier.

When the serial output register 40 transfers the charge packet under the floating gate, the CCD signal is said to be valid. However, during the process of transferring it to the floating gate, or when removing it, the CCD signal is normally not valid. Generally, the A-to-D converter would have to stop and wait until the CCD signal is again valid. However, the sample-and-hold circuit of the present invention allows the A-to-D converter to run continuously and to ignore the period when the CCD signal is not valid. The sample-and-hold circuit samples the value of the analog CCD signal available at the output of the preamplifier 160, and charges capacitor 170 when switch 168 is closed, i.e., when the CCD signal is valid. When the CCD signal is not valid, switch 168 is opened, yet the signal on the capacitor remains valid until the switch is again closed. Hence, the sample-and-hold circuit allows the imaging array to output data even faster, since it provides the A-to-D with a longer time to sample a valid CCD signal and convert it. This can be a significant advantage for high-speed CCDs having a small duty cycle where the output CCD signal is actually valid.

Figure 6B:
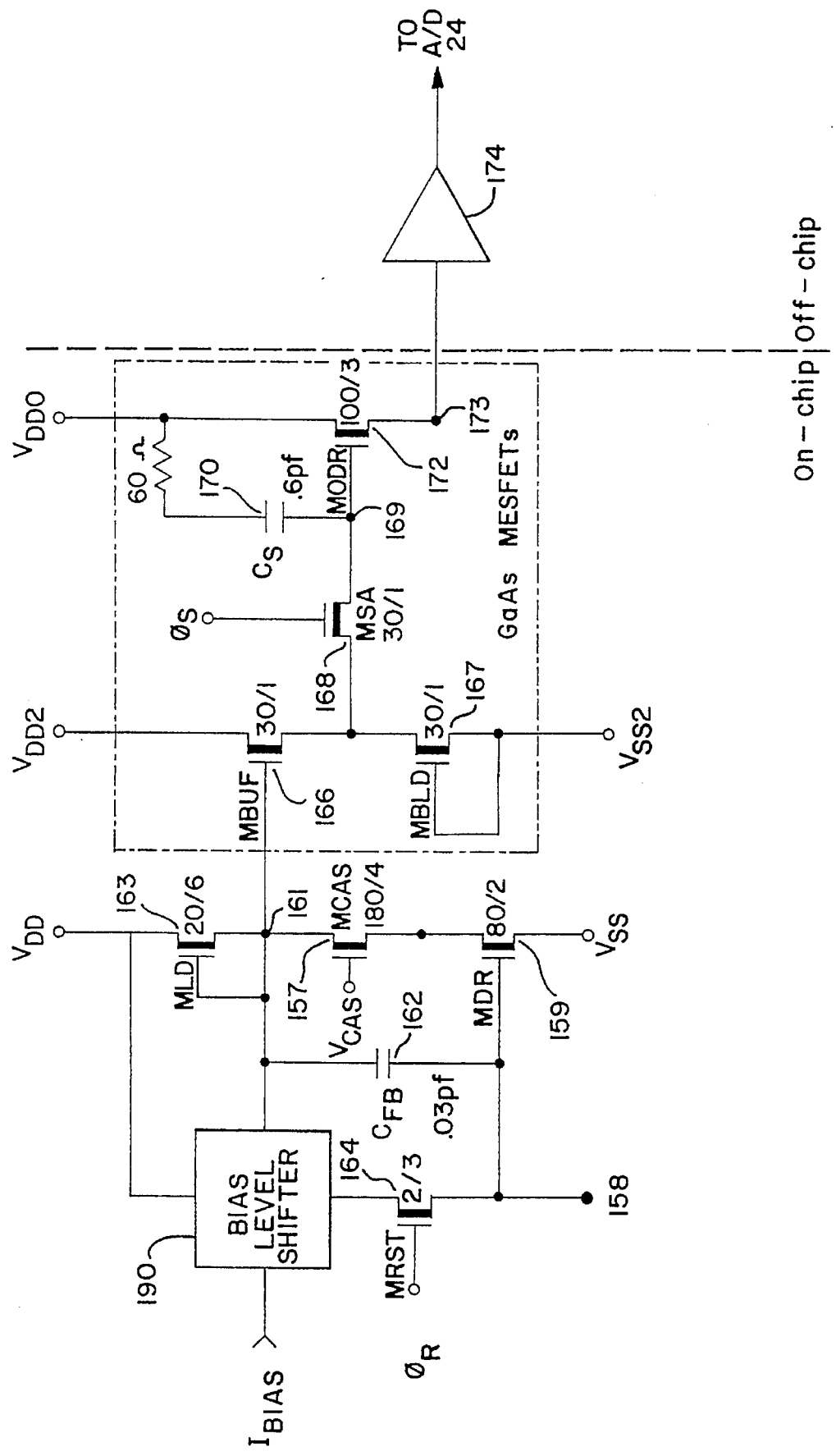

FIG. 6b is a schematic diagram of the output circuitry 42 shown in FIG. 6a. The input to the preamplifier 160 is provided at contact node 158, which is connected to the floating gate 154 of the CCD. This input signal is applied through a driver transistor 159 to a cascode transistor 157, to form a cascode amplifier having a common gate connected to a bias voltage $V_{CASCODE}$. The output of the preamplifier 160 is at node 161. A transistor 163 is configured as a load resistor. Capacitor 162 is configured as a feedback capacitor across the preamplifier to provide capacitive feedback for gain stability and offset correction. In the preferred embodiment, the value of feedback capacitor 162 is 0.032 picofarad (pf). However, depending upon the sensitivity required for the preamplifier 160, the feedback capacitor 162 could have a value in the range of 0.010 pf to 1.0 pf. The reset transistor 164 serves to reset the voltage on the floating gate to a known bias point determined by bias level shifter 190. A first supply voltage $V_{DD}$ and first return voltage $V_{SS}$ are connected as shown. As is known in the art, the length/width dimensions of the integrated transistors are illustrated next to each device.

At the output of the preamplifier 161, the sample-and-hold circuit is bump-mounted to the silicon chip. Bump-mounting is necessary because, in the preferred embodiment, the sample-and-hold circuit is constructed of GaAs FET devices. The preamplified signal at node 161 is applied to buffer transistor 166, whereas transistor 167 is configured as a load resistor. Another GaAs FET 168 is configured as the sampling switch to apply the input signal to the sampling capacitor 170. The value of the sampling capacitor 170 is typically within the range of 10 pf to 0.10 pf, and, in the preferred embodiment, is equal to 0.60 pf. The gate of the sampling transistor 168 is controlled by the sample-and-hold signal $\phi_S$ as will be shown below. A 60 ohm resistor is coupled in series with capacitor 172 to provide additional stability for the amplifier. The sampled analog signal at node 169 is also coupled to the output driver transistor 172. The sampled analog output signal is then routed off-chip at node 173 to buffer amplifier 174. A second supply voltage $V_{DD2}$, a second return voltage $V_{SS2}$, and an output supply voltage $V_{DD0}$ are utilized as shown to reduce noise and cross-coupling between the various sections of the amplifier.

The GaAs FET transistors shown in FIG. 6b are depletion-mode metal semiconductor FETs (MESFETS) which are bump-mounted to the silicon chip at node 161. The bump-mounted GaAs FET circuit module consists of a gallium arsenide die mounted on a 20 mil thick silicon substrate. A 30 μm solder bump contact is used to perform the bump attachment. Solder bumping offers the advantage of a repairable, low-inductance contact. Once the GaAs FET module is bump-mounted, it is complete isolated from the imager substrate currents. Furthermore, bump-mounting provides for an improved thermal expansion match between the GaAs die and the silicon imager substrate. For further information regarding the technical details and other considerations of bump-mounting, refer to the 1987 Semiconductor Data Book on Silicon Devices published by Avantek, Inc. The GaAs FETs used in the preferred embodiment are available in foundry form from Triquint Inc., Beaverton, Oreg., marketed as the "1-D process".

Figure 6C:
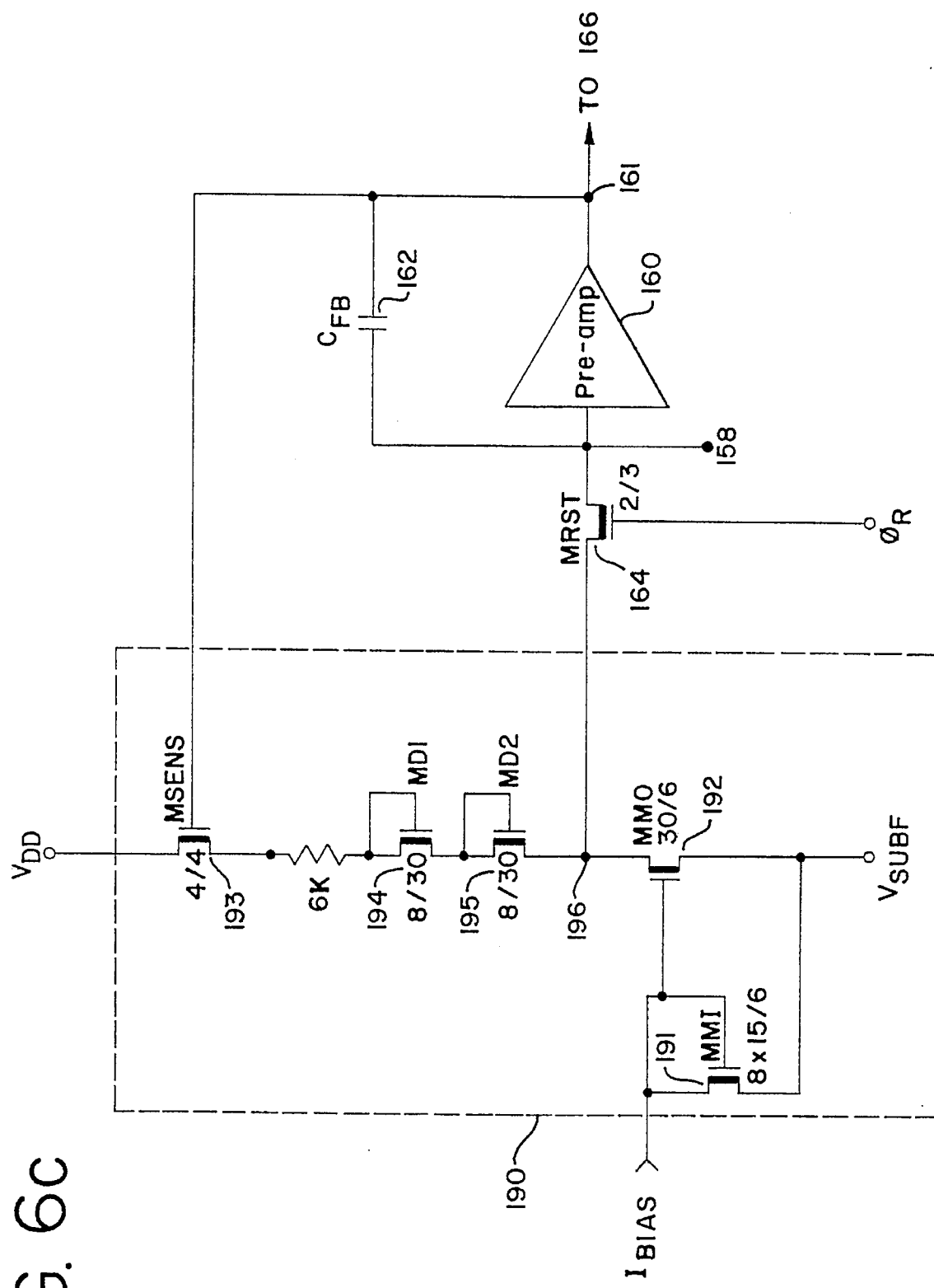
FIG. 6c is an electrical schematic diagram of the bias level shifter block of FIG. 6b.

FIG. 6c is a schematic diagram of the bias level shifter circuit 190. An input biasing current $I_{BIAS}$ is applied to an input bias transistor 191, which is configured as a current mirror with transistor 192. A feedback sensing transistor 193 provides the proper current through two transistors 194 and 195 such that the bias voltage at node 196 matches the output voltage at node 161. When the reset signal $\phi_R$ is applied to the gate of transistor 164, the bias voltage at node 196 is applied to the floating gate at contact node 158. In this manner, the floating gate 154 of the CCD is reset to a constant DC voltage level. Note that the output of preamplifier 160 is capacitively fed back to its input to compensate for any DC offsets and to improve gain stability. The preamplifier 160 therefore acts as an integrating charge sensitive amplifier.

FIG. 6d illustrates timing diagrams for the sample-and-hold circuitry in accordance with the present invention. The sample-and-hold gate signal $\phi_S$ is applied to the gate of sampling transistor 168. A $V_{IN}$ signal represents the preamplified CCD signal at the input to the sample-and-hold circuitry at node 161. Whenever the $V_{IN}$ signal is low, the CCD output data is valid. As can be seen from the Figure, the data is valid for only a small portion of the time before and after times $t_1$, $t_2$, $t_3$, etc. A $V_{OUT}$ signal represents the sample-and-hold signal at the sample-and-hold output node 173. The instantaneous level of the $V_{OUT}$ waveform corresponds to that of the $V_{IN}$ waveform at its valid data times. Note that the data is valid at all times for the $V_{OUT}$ waveform. Hence, the sample-and-hold circuit allows the A-to-D converter to ignore the period when the $V_{IN}$ signal is not valid, thus providing the A-to-D with a longer time to sample the valid CCD data signal and convert it.

In review, it can now be seen that the present invention provides a very high-speed CCD imager. Each of the serial output shift registers are constructed of peristaltic CCDs. This provides the imager with a transfer rate of up to 250 Megasamples/sec for each serial output register, which would otherwise be limited to approximately 50 Megasamples/sec using buried channel CCDs. The use of GaAs FET output transistors allows for very fast resetting of the floating gate as well as for a further increase in output speed. The use of a peristaltic implant in the pinned photodiode provides the present invention with a deeper depletion region, which translates to a higher quantum efficiency over a wider optical bandwidth. The 512×512 pixel imager can operate at 10,000 fps at 164 Megasamples/second per channel output, with a dynamic range of greater than 1000:1, and an optical bandwidth covering 250 to 1000 nm.

As will be apparent to those skilled in the art, the devices of the present invention can be constructed of semiconductor materials having different conductivity types. For example, the P+/N–/N—/P photodiode shown in FIG. 4a may alternatively be constructed of an N+/P–/P—/N conductivity type semiconductor using an N+ arsenic pinning implant instead of a P+ boron pinning implant. Further modifications and improvements may be made by those skilled in the art. All such modifications which retain the basic underlying principles disclosed and claimed herein are within the scope of the invention.

What is claimed is:

1. A CCD imaging array of the interline transfer type comprising:

a silicon semiconductor substrate;

an array of photodiodes disposed on said substrate which produce charge packets when exposed to light;

a plurality of buried channel CCD interline transfer registers disposed on said substrate;

means for supplying a two-phase clock to the plurality of buried channel CCD interline transfer registers for transferring said charge packets from said photodetectors;

a plurality of profiled peristaltic CCD serial output registers disposed on said substrate;

means for supplying a four-phase clock to the plurality of profiled CCD output registers for transferring said charge packets from said interline transfer registers; and a plurality of output circuits for transferring said charge packets from said serial output registers to provide a plurality of output signals.

2. The CCD imaging array according to claim 1, wherein each of said photodiodes of the array of photodiodes is a four-layer pinned photodiode having conductivity types and concentrations arranged as:

P+/N–/N—/P or N+/P–/P—/N.

3. The CCD imaging array according to claim 1, wherein each of said photodiodes includes an antiblooming drain, and antiblooming gate operatively coupling said charge packets to said antiblooming drain, and a variable pulse width gate signal operatively coupled to said antiblooming gate, wherein said antiblooming gate selectively discharges said charge packets via said antiblooming drain when said gate signal is in an active state.

4. The apparatus as in claim 1 further comprising an antiblooming drain associated with each photodiode of the array of pinned photodiodes.

5. The apparatus as in claim 4 further comprising a shutter control for activating the antiblooming drain during a variable portion of each frame period.

6. A CCD imaging array of the interline transfer type comprising:

a silicon semiconductor substrate;

an array of photodiodes disposed on said substrate which produce charge packets when exposed to light;

a plurality of buried channel CCD interline transfer registers disposed on said substrate;

means for supplying a two-phase clock to the plurality of buried channel CCD interline transfer registers for transferring said charge packets from said photodiode;

a plurality of profiled peristaltic CCD serial output registers disposed on said substrate;

means for supplying a four-phase clock to the plurality of profiled peristaltic CCD serial output registers for transferring said charge packets from said interline transfer registers;

an antiblooming structure associated with each photodiode; and a plurality of output circuits for transferring said charge packets from said serial output registers to provide a plurality of output signals.

7. The CCD imaging array according to claim 6, wherein each of said photodiodes of the array of photodiodes is a four-layer pinned photodiode having conductivity types and concentrations arranged as:

P+/N–/N—/P or N+/P–/P—/N.

8. The CCD imaging array according to claim 6, wherein each antiblooming structure further comprises an antiblooming drain, and antiblooming gate operatively coupling said charge packets to said antiblooming drain, and a variable pulse width gate signal operatively coupled to said antiblooming gate, wherein said antiblooming gate selectively discharges said charge packets via said antiblooming drain when said gate signal is in an active state.

9. The CCD imaging structure according to claim 6 wherein the antiblooming structure further comprises:

an antiblooming drain disposed substantially adjacent each photodetector;

a source of constant DC potential connected to each antiblooming drain, said source being of the type which will remove any charge disposed within said drains;

a gate disposed between each photodetector and its corresponding antiblooming drain, each gate constructed and arranged to control the charge transfer from each photodetector to each drain in response to a gating signal; and means for providing said gating signal to said gates, said gating signal having a predefined period substantially the same as said frame rate, and having a variable duty cycle.

10. A solid state imaging array comprising:

an array of photodetectors which produce charge packets when exposed to light;

a plurality of CCD shift registers for transferring said charge packets from said photodetectors to an imaging array output;

means for supplying a two-phase clock to at least some of the plurality of CCD shift registers for urging said charge packets towards the imaging array output;

means for supplying a four-phase clock to at least some other of the CCD shift registers for urging said charge packets towards the imaging array output; and means for outputting at the imaging array output a voltage signal from said imaging array in response to said transferred charge packets.

\* \* \* \* \*

UNITED STATES PATENT AND TRADEMARK OFFICE
CERTIFICATE OF CORRECTION

PATENT NO. : 5,614,740
DATED : Mar. 25, 1997
INVENTOR(S) : Gardner et al.

It is certified that error appears in the above-indentified patent and that said Letters Patent is hereby corrected as shown below:

Col. 1, line 3, insert --The U.S. Government has a paid-up license in this invention and the right in limited circumstances to require the patent owner to license others on reasonable terms as provided for by the terms of Contract No. DAAA15-89-C-0006 awarded by the U.S. Army.--.
Col. 1, line 65, change "aide" to --aid--.
Col. 2, line 32, change "Junction" to --junction--.
Col. 4, Line 52, before "controller 14" insert --the--.
Col. 8, line 14, change "are" to --is--.
Col. 12, line 46, after "A-to-D" insert --converter--.
Col. 13, line 26, change "MESFETS" to --MESFETs--.
Col. 13, line 34, change "complete" to --completely--.
Col. 14, line 7, after "A-to-D" insert --converter--.

Col. 16, line 8, after "adjacent" insert --to--.

Signed and Sealed this

Fifth Day of August, 1997

Attest:

Attesting Officer

BRUCE LEHMAN

Commissioner of Patents and Trademarks